US011670385B2

(12) United States Patent
Tailliet et al.

(10) Patent No.: US 11,670,385 B2
(45) Date of Patent: *Jun. 6, 2023

(54) METHOD FOR WRITING AN ELECTRICALLY ERASABLE AND PROGRAMMABLE NON VOLATILE MEMORY AND CORRESPONDING INTEGRATED CIRCUIT

(71) Applicant: STMicroelectronics (Rousset) SAS, Rousset (FR)

(72) Inventors: François Tailliet, Fuveau (FR); Chama Ameziane El Hassani, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/558,123

(22) Filed: Dec. 21, 2021

(65) Prior Publication Data

US 2022/0115077 A1   Apr. 14, 2022

Related U.S. Application Data

(63) Continuation of application No. 16/824,268, filed on Mar. 19, 2020, now Pat. No. 11,238,944.

(30) Foreign Application Priority Data

Apr. 5, 2019   (FR) ..................................... 1903667

(51) Int. Cl.
*G11C 16/32* (2006.01)
*G11C 16/10* (2006.01)

(52) U.S. Cl.
CPC .............. *G11C 16/32* (2013.01); *G11C 16/10* (2013.01)

(58) Field of Classification Search
CPC ................................ G11C 16/32; G11C 16/10
USPC ...................................................... 365/185.18
See application file for complete search history.

(56) References Cited

U.S. PATENT DOCUMENTS

| | | | |
|---|---|---|---|
| 3,873,778 | A | 3/1975 | Mutsuura |
| 5,963,502 | A | 10/1999 | Watanabe et al. |
| 6,111,712 | A | 8/2000 | Vishakhadatta et al. |
| 7,190,937 | B1 | 3/2007 | Sullivan et al. |
| 7,375,549 | B1 | 5/2008 | Tang et al. |
| 7,411,427 | B1 | 8/2008 | Fong |
| 8,791,734 | B1 | 7/2014 | Hara et al. |
| 8,948,209 | B2 | 2/2015 | Tailliet |

(Continued)

FOREIGN PATENT DOCUMENTS

WO    9205562 A1    4/1992

OTHER PUBLICATIONS

NXP Semiconductors, UM 10204, "I2C-bus specification and user manual", Rev. 6-4, Apr. 2014, 64 pages.

*Primary Examiner* — Sung Il Cho
(74) *Attorney, Agent, or Firm* — Slater Matsil, LLP

(57) ABSTRACT

A method for writing to electrically erasable and programmable non-volatile memory and a corresponding integrated circuit are disclosed. In an embodiment a method includes operatively connecting a filter circuit belonging to a communication interface to an oscillator circuit, wherein the communication interface is physically connected to a bus, generating, by the oscillator circuit, an oscillation signal and regulating the oscillation signal by the filter circuit so as to generate a clock signal for timing a write cycle.

20 Claims, 6 Drawing Sheets

(56) References Cited

U.S. PATENT DOCUMENTS

| | | |
|---|---|---|
| 9,753,886 B2 | 9/2017 | Tailliet |
| 2002/0113643 A1 | 8/2002 | La Rosa |
| 2005/0122152 A1 | 6/2005 | Yoshida et al. |
| 2007/0106836 A1* | 5/2007 | Lee .................... G06F 13/385 |
| | | 711/E12.019 |
| 2007/0153953 A1* | 7/2007 | Garzarolli ............. H03L 7/183 |
| | | 375/376 |
| 2008/0177918 A1 | 7/2008 | Lee et al. |
| 2009/0224838 A1* | 9/2009 | Schlueter ............ H03L 7/1075 |
| | | 331/17 |
| 2013/0169857 A1* | 7/2013 | Christo ................. H04N 23/67 |
| | | 348/349 |
| 2014/0082398 A1 | 3/2014 | Lee et al. |
| 2018/0107239 A1 | 4/2018 | Anderson et al. |
| 2019/0004984 A1 | 1/2019 | Lee et al. |

\* cited by examiner

[Fig 6A]
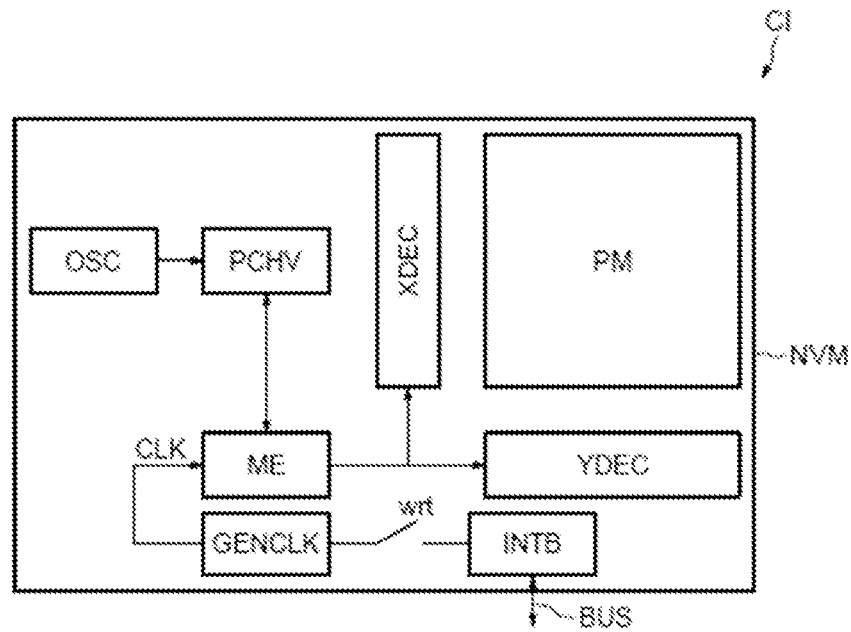
[Fig 6B]
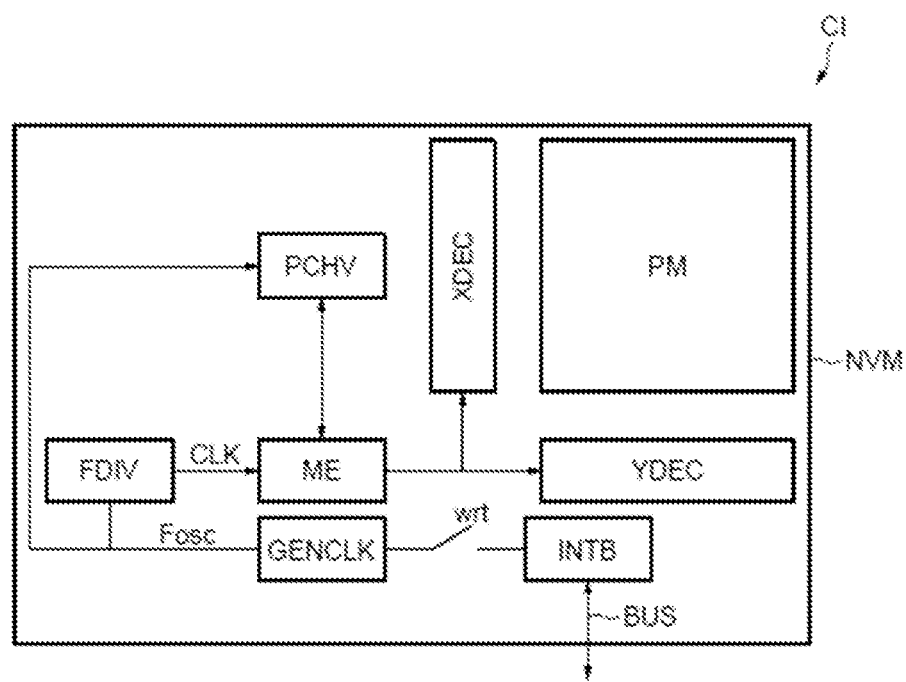

025 # METHOD FOR WRITING AN ELECTRICALLY ERASABLE AND PROGRAMMABLE NON VOLATILE MEMORY AND CORRESPONDING INTEGRATED CIRCUIT

CROSS-REFERENCE TO RELATED APPLICATIONS

This application is a continuation application of U.S. application Ser. No. 16/824,268, filed on Mar. 19, 2020, which application claims priority to French Patent Application No. 1903667, filed on Apr. 5, 2019, which applications are hereby incorporated by reference herein in their entirety.

TECHNICAL FIELD

Implementations and embodiments relate to integrated circuits of non-volatile memories, particularly writing to electrically erasable programmable read-only memory (EEPROM).

BACKGROUND

Integrated circuits of EEPROM memories typically comprise a memory plane for storing the stored data, decoders for accessing the data in the memory plane, and a peripheral portion.

The peripheral portion typically comprises a logic portion dimensioned for a power supply of, e.g., 5 V, conventionally comprising control means and a communication interface such as an I²C ("Inter-Integrated Circuits," a standard well-known to the person skilled in the art) bus interface. The peripheral portion also comprises an analogue portion comprising high voltage or voltage ramp generators, amplifiers, and reference current generators.

SUMMARY

It is desirable to reduce the overall dimensions of the integrated circuit devices.

Techniques have been provided for reducing the size of the EEPROM memory plane.

However, for a given total memory capacity, the advantages of reducing the memory plane are partly dispelled by the overall dimensions of the peripheral portion. This phenomenon is worse for the lowest memory densities.

An efficiency parameter may be defined for the area of the memory plane "AE" where AE designates the ratio (area of the memory plane+decoders)/total area of the memory.

For example, for a memory of 128 kbit AE>50% in 0.18 µm technology, and AE<30% in 0.11 µm technology.

Accordingly, the shrinkage of the memory plane does not result in a significant gain in the complete product, particularly on low densities.

Moreover, many constraints prevent reducing the size of the components of the peripheral portion.

The peripheral portion comprises high voltage elements the dimensions of which are not practically capable of being reduced due to voltage stability constraints. The peripheral portion also comprises analogue components subjected to matching constraints (according to the usual term designating the design of elements whereof the characteristics exhibit little variation from one to another), which require large size components.

The elements meeting standards, e.g., communication interfaces such as an I²C interface, are provided with elements dedicated to their uses and do not, or only slightly benefit from manipulating their design in order to reduce their size.

However, it is desirable to reduce the overall dimensions of the peripheral portion of EEPROM memories in order to improve the efficiency parameter AE of the area of the memory plane.

EEPROM memories typically require an oscillator for activating a charge pump. This oscillator is preferably relatively fast. The oscillation frequency may be of medium precision, e.g., between 20 MHz and 30 MHz.

Also, EEPROM memories typically require a clock for timing write operations, and from which the write time is deduced, advantageously as accurately as possible. This clock may be slower (typically of the order of 1 MHz), but preferably accurate.

It is difficult in the context of EEPROM technologies, and within a constraint of minimum dimensions, to produce accurate oscillators, especially if they should to be fast.

Thus, EEPROM memories typically comprise a stable signal generator dedicated to the generation of a clock signal, while other generators are used for generating other oscillation signals, notably with high frequencies.

Embodiments are provided for generating stable frequencies based on a time reference already present on the circuit for other purposes, and not used for its initial purpose when it is used for stabilizing the frequencies.

Further embodiments provide that the area of the peripheral portion may be reduced, and the efficiency parameter AE of the area of the memory plane may be improved.

According one embodiment, a method of writing to an electrically erasable programmable read-only memory (EEPROM) is provided in this regard, comprising in a write cycle: operatively connecting a filter circuit belonging to a communication interface physically connected to a bus, with an oscillator circuit and generating via the oscillator circuit an oscillation signal and regulating the oscillation signal with the filter circuit, so as to generate a clock signal for timing the write cycle.

A write cycle designates the phase dedicated to writing data into the memory, generally comprising an erasure followed by programming one or more memory cells.

Preferably, the communication interface is of the I²C type, i.e., of the "inter-integrated circuits" type.

Thus according to this embodiment provision is made to use a filter circuit provided for a communication interface, for regulating an oscillation signal and thereby generating a sufficiently stable clock signal for timing the write cycle.

The method according to this embodiment thus makes it possible to meet the two constraints mentioned above, using only a single oscillator circuit.

According to one implementation, before operatively connecting the filter circuit with the oscillator circuit, the filter circuit is operatively disconnected from the communication interface.

During a write cycle, the exchanges on the bus via the communication interface are ignored, e.g., conventionally by forcing a reset of an output flip-flop intended for generating a circuit selection signal, preventing the selection of the circuit from a command transmitted to the communication interface of the I²C type, for the duration of the write cycle. However, spurious signals originating from outside may be transmitted on the bus, and operatively disconnecting the filter circuit from the communication interface prevents disruptions in the filter circuit originating from outside.

For example, before operatively connecting the filter circuit with the oscillator circuit, the filter circuit is operatively disconnected from the oscillator circuit and is operatively connected to the communication interface.

Conversely, this makes it possible for communications on the bus with the communication interface using the filter circuit not to be disrupted by the oscillation signal of the oscillator circuit.

According to one implementation, operatively connecting the filter circuit and the oscillator circuit comprises logic operations on a signal originating from the oscillator circuit and intended for the filter circuit with a mode selection signal, so as to deliver a signal to the filter circuit according to the signal originating from the oscillator circuit. Similarly, operatively connecting the filter circuit and the oscillator circuit comprises logic operations on a signal originating from the filter circuit and intended for the oscillator circuit with the mode selection signal, so as to deliver a signal to the oscillator circuit according to the signal originating from the filter circuit.

According to one implementation, operatively disconnecting the filter circuit and the communication interface comprises logic operations on a signal originating from the communication interface and intended for the filter circuit with a mode selection signal, the mode selection signal determining the result of the logic operations with a signal of constant arbitrary value, and logic operations on a signal originating from the filter circuit and intended for the communication interface with the mode selection signal, the mode selection signal determining the result of the logic operations with a signal of constant arbitrary value.

According to one implementation, the filter circuit has an adjustable time constant, and before regulating the oscillation signal with the filter circuit, the time constant is adjusted to a given value with a given precision.

Indeed, this makes it possible to improve the accuracy of the clock signal thus generated via regulation, the time constant of the filter circuit being able to undergo slight manufacturing process instabilities which are thus corrected by said adjustment, but being otherwise very stable with respect to temperature, power supply and ageing conditions According to one alternative, the frequency of the oscillation signal is dynamically adjustable, and the regulation of the oscillation signal comprises a dynamic adjustment of the frequency of the oscillation signal relative to a time constant of the filter circuit.

This alternative may advantageously correspond to the use of an oscillator circuit capable of generating high frequencies for timing a charge pump, according to an implementation defined below.

Thus the frequency of the oscillation signal may be calibrated dynamically with respect to immediate variations, e.g., due to temperature, voltage and ageing conditions, being based on said time constant which is itself stable with respect to said conditions.

According to one implementation of this alternative, said regulation of the oscillation signal is performed at the start of each write cycle.

One calibration per write cycle is a period sufficient to compensate for the occurrence of variations in the frequency.

According to one implementation of this alternative, said dynamic adjustment of the frequency of the oscillation signal comprises counting the number of periods of the oscillation signal for the duration of the time constant, an adjustment of a level of the frequency of the oscillation signal, and a repetition of the counting and the adjustment until the number of counted periods closest to a preset targeted number is reached.

According to one implementation of this alternative, generating the clock signal further comprises a division of the frequency of the regulated oscillation signal.

According to one implementation of this alternative, the method further comprises in a write cycle, a generation of write high voltages comprising switchings of capacitive elements to supply voltages, the switchings being timed by the oscillation signal generated by the oscillator circuit.

According to another alternative, the generation of an oscillation signal comprises an accumulation of elementary delays, and the regulation of the oscillation signal comprises an insertion, in said accumulation, of an additional delay equal to a time constant of the filter circuit, the accumulation of elementary delays being negligible in duration with respect to the additional delay.

This alternative corresponds to the use of a conventional ring oscillator for generating the clock signal, but with the advantage of re-using the filter circuit of the communication interface when the latter is not used for this purpose.

According to another embodiment, an integrated circuit of an electrically erasable and programmable non-volatile memory is provided, comprising a state machine configured for controlling write operations in a write cycle timed by a clock signal, a communication interface comprising a filter circuit and physically connected to a bus, and means for generating the clock signal comprising an oscillator circuit and configured for, in a write cycle: operatively connecting the filter circuit with the oscillator circuit and generating an oscillation signal with the oscillator circuit and regulating the oscillation signal with the filter circuit, so as to generate the clock signal.

According to one embodiment, the means for generating the clock signal are configured for operatively disconnecting the filter circuit from the communication interface, before operatively connecting the filter circuit with the oscillator circuit.

According to one embodiment, the filter circuit is intended to be operatively disconnected from the oscillator circuit and to be operatively connected to the communication interface before being operatively connected with the oscillator circuit.

According to one embodiment, for operatively connecting the filter circuit and the oscillator circuit, the means for generating the clock signal comprise logic gates connected to an input of the filter circuit configured for, in the presence of a mode selection signal, generating on the input of the filter circuit a signal according to a signal originating from the oscillator circuit. And, the means for generating the clock signal also comprise logic gates connected to an output of the filter circuit configured for, in the presence of the mode selection signal, generating on an input of the oscillator circuit a signal according to a signal on the output of the filter circuit.

According to one embodiment, for operatively disconnecting the filter circuit and the communication interface, the means for generating the clock signal comprise logic gates connected respectively to an input of the filter circuit and to an output of the filter circuit, the logic gates being configured for generating a signal with a constant arbitrary value in the presence of a mode selection signal, equally signals intended for the filter circuit originating from the communication interface or signals at the output of the filter.

According to one embodiment, the filter circuit has an adjustable time constant, and the means for generating the clock signal are configured for adjusting the time constant to a given value with a given precision.

According to a first alternative, the oscillator circuit comprises an adjustment means capable of dynamically adjusting the frequency of the oscillation signal on command, and the means for generating the clock signal are configured for controlling a dynamic adjustment of the frequency of the oscillation signal relative to a time constant of the filter circuit, for regulating the oscillation signal.

According to one embodiment of the first alternative, the adjustment means of the oscillator circuit comprises a capacitive element with controllable capacitive value, or a power supply current generator with controllable current intensity.

According to one embodiment of the first alternative, the means for generating the clock signal are configured for regulating the oscillation signal at the start of each write cycle.

According to one embodiment of the first alternative, the adjustment means of the oscillator circuit comprises a counter configured for counting the number of periods of the oscillation signal for the duration of the time constant, and is configured for adjusting the frequency of the oscillation signal by an elementary level, and for repeating the counting and the adjustment until the number of counted periods closest to a preset targeted number is reached.

According to one embodiment of the first alternative, the means for generating the clock signal further comprise a frequency divider configured for dividing the frequency of the regulated oscillation signal.

According to one embodiment of the first alternative, the integrated circuit further comprises a charge pump circuit configured for generating write high voltages comprising switchings of capacitive elements over to power supply voltages, the switchings being timed by the oscillation signal generated by the oscillator circuit.

According to another alternative, the oscillator circuit comprises a ring oscillator configured for generating an accumulation of elementary delays on a signal, and the means for generating the clock signal are configured for connecting the filter circuit in a ring oscillator circuit, introducing an additional delay equal to a time constant of the filter circuit, the accumulation of elementary delays being negligible in duration with respect to the additional delay.

BRIEF DESCRIPTION OF THE DRAWINGS

Other advantages and features of the invention will appear on examining the detailed description of embodiments and implementations, in no way restrictive, and the appended drawings in which:

FIGS. 1-5, 6A, and 6B illustrate implementations according to embodiments.

DETAILED DESCRIPTION OF ILLUSTRATIVE EMBODIMENTS

Figure 1:
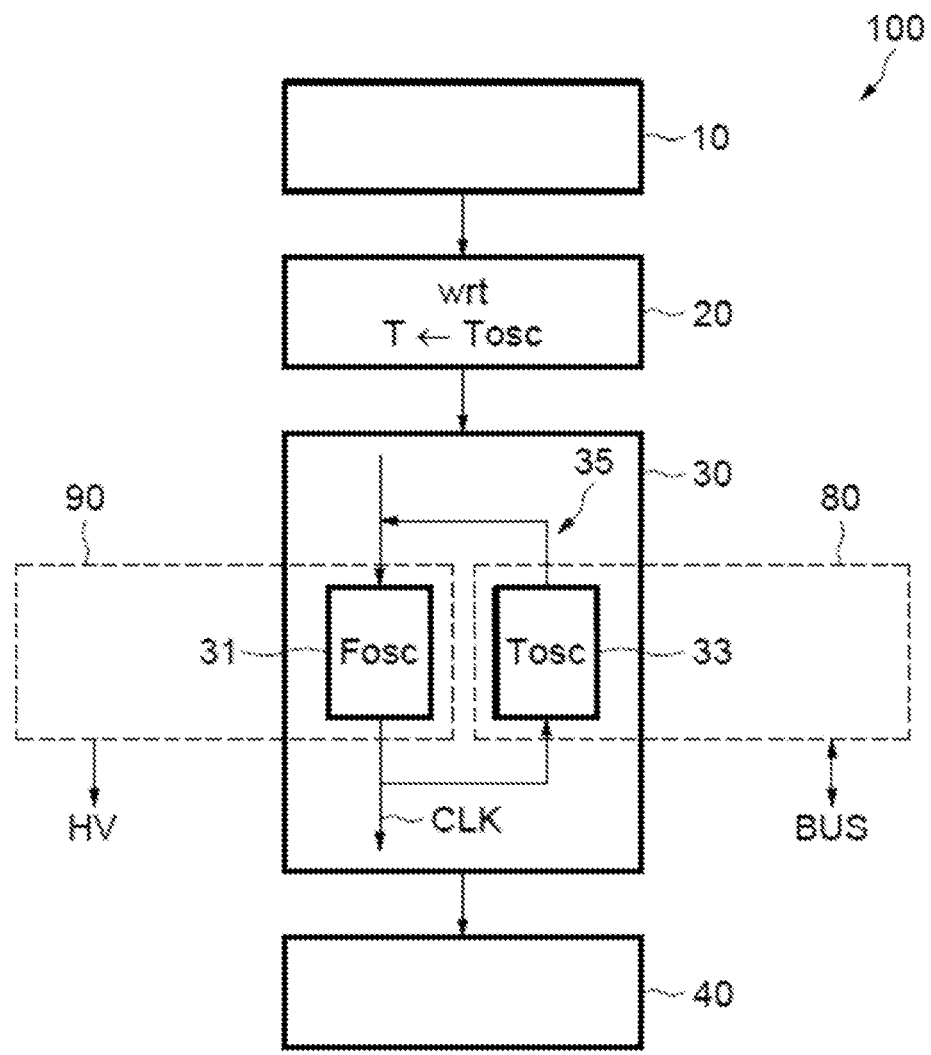

FIG. 1 illustrates an implementation of a method of writing to an electrically erasable programmable read-only memory "EEPROM". The EEPROM memory notably comprises a memory plane comprising memory cells, a memory cell being a unit in which a bit can be recorded, an oscillator circuit 90 and a communication interface 80 comprising a filter circuit 33. The communication interface 80 is intended for communicating on a bus BUS and is physically connected to the bus BUS. The filter circuit 33 may conventionally comprise a capacitive element and a resistive element. The exchanges on the bus BUS via the communication interface 80 are intended to be ignored during a write cycle.

A write cycle of the writing method comprises, for example, an erasure followed by a programming of one or more memory cells.

The method comprises, in a write cycle 100, the following steps: operatively connecting 20 a filter circuit 33 belonging to a communication interface 80 physically connected to the bus BUS, with an oscillator circuit 31 and generating via the oscillator circuit 31 an oscillation signal Fosc and regulating 35 the oscillation signal Fosc with the filter circuit 33, so as to generate 30 a clock signal CLK for timing 40 the write cycle.

Before the generation of the clock signal for timing 40 the write cycle, an independent elementary clock of a state machine may, for example, make it possible to time the implementation of the method.

In this example, the filter circuit 33 has an adjustable time constant T, and before regulating 35 the oscillation signal Fosc with the filter circuit 33, the time constant T is adjusted to a given value Tosc with a given precision.

The adjustment of the time constant T may be implemented by means of adjustment bits ("trimming bits" according to the usual term), stored in a non-volatile register, e.g., a portion of the memory plane dedicated to this purpose. The adjustment bits may control a switching of a respective capacitive or resistive element, in order to compensate for the variations due to the manufacturing methods of an effective capacitive or resistive value. The adjustment bits are factory set in accordance with said effective capacitive or resistive value and the targeted time constant Tosc.

In the representation of FIG. 1, the adjustment of the time constant T to the value Tosc is performed in step 20 providing for operatively connecting the filter circuit 33 with the oscillator circuit 31. However, it is not necessary that the adjustment of the time constant T is performed at the same time as the operative connection of the filter circuit with the oscillator circuit, but may be performed before or after said connection.

Before operatively connecting 20 the filter circuit with the oscillator circuit, it is advantageous to operatively disconnect the filter circuit 33 and the communication interface 80.

Indeed, before operatively connecting the filter circuit 33 with the oscillator circuit 31, the configuration of the device may be such that the filter circuit 33 is operatively disconnected from the oscillator circuit 31 and is operatively connected to the communication interface 80, according to a first destination of the filter circuit 33.

The write cycle 100, in order to erase and program memory cells, may further include a generation 90 of write high voltages HV, advantageously by means of a charge pump. The generation of the write high voltages HV in this case comprises switchings of capacitive elements to supply voltages, the switchings being timed by the fast oscillation signal Fosc, e.g., of the order of 10 MHz to 100 MHz. The stability of the fast oscillation signal is not critical for generating write high voltages with a charge pump and the frequency of the fast oscillation signal may vary by about 25% without compromising the operation of the charge pump.

However, the time constant of the filter circuit Tosc is itself very stable, and makes it possible to stabilize the fast oscillation signal via said regulation 35, for obtaining a sufficiently stable clock signal CLK for timing 40 the write cycle.

In a particular example, the fast oscillation signal Fosc is generated by the oscillator circuit 31, and generating 30 the clock signal further comprises a division of the frequency (not represented) of the regulated (fast) oscillation signal Fosc.

Indeed, the frequency of the clock signal CLK, for timing the write cycle, is conventionally much lower than the frequency of the fast oscillation signal Fosc. For example, the frequency of the clock signal CLK is not greater than 2 MHz or even 1 MHz.

Figure 2:
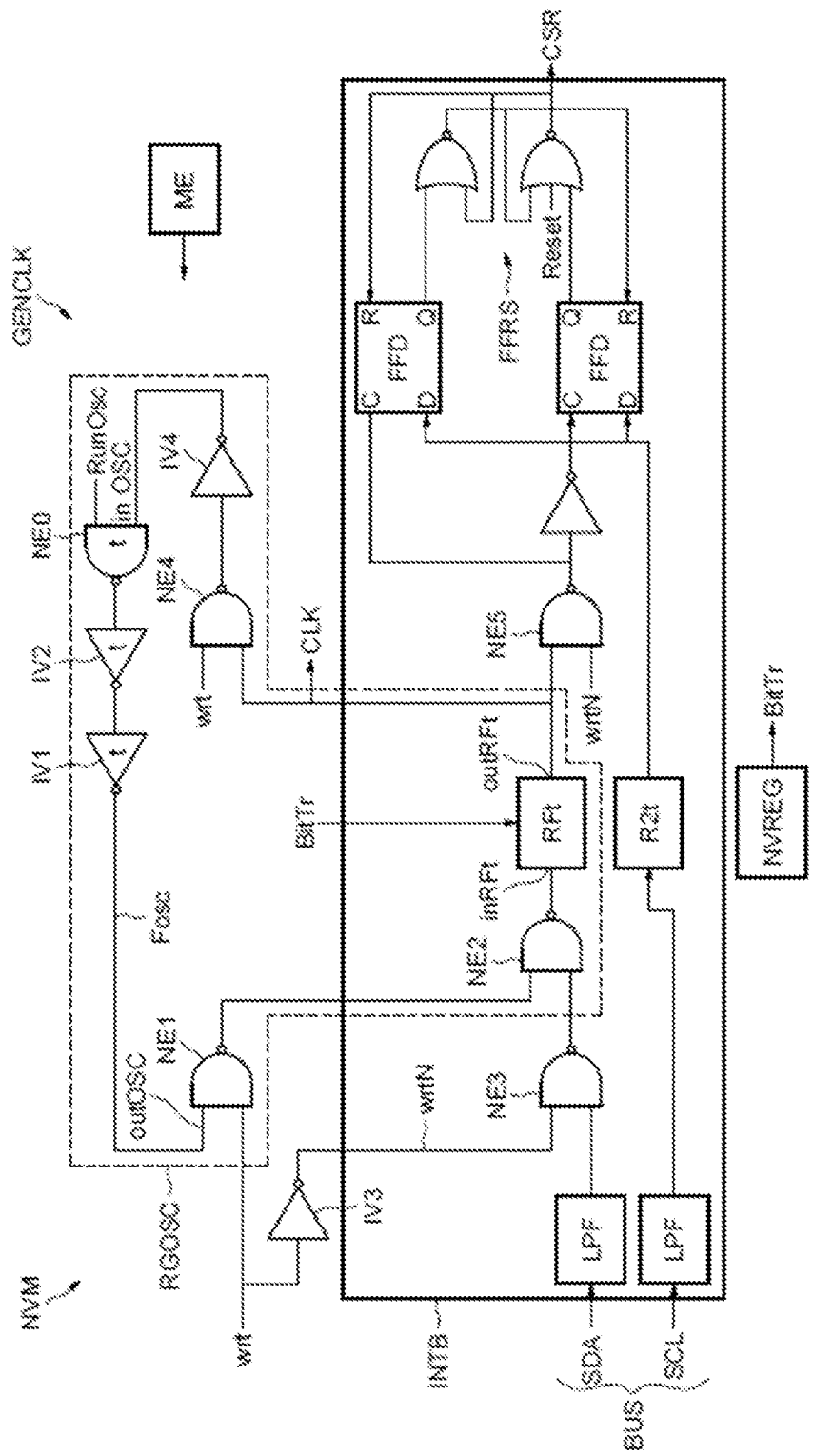

FIG. 2 illustrates an embodiment of an integrated circuit of an electrically erasable and programmable non-volatile memory NVM.

The integrated circuit NVM comprises a state machine ME configured for controlling write operations in a write cycle timed by a clock signal CLK, a communication interface INTB comprising a filter circuit RFt and physically connected to a bus BUS, and means for generating the clock signal GENCLK comprising an oscillator circuit RGOSC.

As mentioned previously, the state machine ME may comprise an independent elementary clock for timing the initial operations making it possible to introduce the generation of the clock signal CLK (method of FIG. 1).

The means for generating the clock signal GENCLK are configured for, in a write cycle: operatively connecting the filter circuit RFt with the oscillator circuit RGOSC, generating an oscillation signal Fosc with the oscillator circuit RGOSC and regulating the oscillation signal with the filter circuit RFt, so as to generate the clock signal CLK.

The communication interface INTB is, for example, an interface with an I²C type serial bus BUS, i.e., of the "inter-integrated circuit" type and communicating according to the protocol of the same name.

The I²C bus BUS comprises two channels: a serial data channel SDA and a serial clock channel SCL, carrying signal frames each capable of having a high level or a low level.

Low pass filter circuits LPF are intended for filtering positive pulses on a low level or negative ones on a high level of less than 60 ns at the SDA input and the SCL input.

In a communication according to the I²C protocol, a start of frame condition, "START" according to the official terminology known to the person skilled in the art, consists of a high to low transition (falling edge) on SDA when SCL is high, and an end of frame condition "STOP" according to said official terminology, consists of a low to high transition (rising edge) on SDA when SCL is high.

Internal delays are added onto SDA and SCL signals for ensuring that the SDA transitions close to SCL transitions cannot generate START or STOP conditions. The SDA transitions may occur at a time t after the SCL rising edge or a time t before the SCL falling edge to trigger the START or STOP conditions.

This is confirmed by delaying the SCL rising edges by a duration 2t with a filter circuit R2t, and delaying the SDA rising and falling edges by a period t with a filter circuit RFt.

The delayed SCL signal is an input of two edge-triggered D type flip-flops FFD, whereof the clocks are the delayed SDA signal and its complement respectively. The output of the flip-flops FFD forms the input of an RS type flip-flop FFRS generating a chip select signal CSR and resetting the flip-flops FFD.

According to one feature of EEPROM memory integrated circuits communicating via the I²C protocol, a write cycle begins after reception of a legitimate write command ending with a STOP condition.

During the write operation (which generally lasts a few milliseconds), the memory does not respond to any command from the I²C bus. This means that the SDA and SCL data are ignored, as well as the detection of the START and STOP conditions.

The write circuits rely on sequencers based on clocks, according to the architecture used, which include the independent elementary clock of the state machine ME, and a clock input of a counter (not represented) which determines the erasure pulse time and/or the programming pulse time and/or the write cycle time.

The time constant T of a filter circuit RFt, R2t of the communication interface INTB (in this example the filter circuit RFt), free from use at the time of the write cycle, is reused in this respect by operatively connecting the filter circuit RFt with the oscillator circuit RGOSC.

The low pass filter circuits LPF are also free from use at the time of the write cycle, and their time constants may also be reused for generating a clock signal for timing the write cycle.

In fact, any element having a time constant (typically a filter circuit) not used during the write cycle may be used for generating the clock signal.

Also, it is conceivable to use combinations of filters by cascading them two by two, three by three or four by four.

For example, before operatively connecting the filter circuit RFt with the oscillator circuit RGOSC, the means for generating the clock signal GENCLK are configured for operatively disconnecting the filter circuit RFt and the communication interface INTB.

Indeed, in this example, before being operatively connected with the oscillator circuit RGOSC, the filter circuit RFt is intended to be operatively disconnected from the oscillator circuit RGOSC and to be operatively connected to the communication interface INTB.

"Operatively connecting" and "operatively disconnecting" are understood to mean, of course, that the connections and disconnections are not carried out physically, but that access to the functions of the filters are enabled or disabled in a circuit physically connected to all its component elements (filter circuit RFt, communication interface INTB and oscillator circuit RGOSC), e.g., by means of a selection logic signal (wrt).

For example, for operatively connecting the filter circuit RFt and the oscillator circuit RGOSC, the means for generating the clock signal GENCLK comprise logic gates, in particular NAND gates controlled by a mode selection logic signal wrt=1.

Logic gates are connected to an input of the filter circuit in RFt and to an output of the oscillator circuit outOSC and are configured for supplying the input of the filter circuit inRFt with a signal according to a signal outOSC originating from the oscillator circuit RGOSC and intended for the filter circuit RFt.

Indeed, with reference to FIG. 2, the mode selection signal wrt=1 and the oscillation signal originating from the oscillator circuit outOSC are applied at the input of the NAND gate NE1, thereby generating the inverse of the signal outOSC. The output from the NAND gate NE1 is inverted by the NAND gate NE2 receiving a signal set to 1 originating from the NAND gate NE3 which receives the signal wrtN=0 inverted from wrt=1 by the inverter W3.

In addition, logic gates are connected to an input of the oscillator circuit inOSC and to an output of the filter circuit outRFt and are configured for generating a signal according to a signal at the output of the filter circuit outRFt and intended for the oscillator circuit.

Indeed, with reference to FIG. 2, the mode selection signal wrt=1 and the signal originating from the output of the filter circuit outRFt are applied to the input of the NAND gate NE4, generating an inverse signal of the signal inOSC, itself inverted by the inverter W4 at the input of the oscillator circuit inOSC.

Simultaneously, for operatively disconnecting the filter circuit RFt and the communication interface INTB, the means for generating the clock signal GENCLK comprise said logic gates controlled by the mode selection signal wrt=1.

With wrt=1, the logic gates are configured for supplying a signal with a constant arbitrary value, regardless of values at the input of the filter originating from the SDA communication interface or output values outRFt from the filter intended for the communication interface.

Indeed, as mentioned above, the inverter W3 transmits a signal wrtN=0 to the input of the NAND gate NE3 which thereby generates a signal with a constant arbitrary value set to 1, whatever the value of the SDA signal on its other input originating from the communication interface INTB. In addition, the signal wrtN=0 is applied at the input of the logic gate NE5, which thereby generates a signal with a constant arbitrary value set to 1 to the flip-flops FFD (the two flip-flops FFD receive opposite signals, the signal of constant arbitrary value being inverted for one of the two), whatever the value of the signal originating from the output of the filter circuit outRFt applied to its other input.

Also, when operatively connecting the filter circuit RFt with the oscillator circuit RGOSC, a Reset signal of the RS flip-flop FFRS is active (set to 1). The Reset signal is active from the valid STOP condition which starts the writing in the memory plane; therefore prior to the connection of the filter circuit RFt to the oscillator circuit RGOSC. This Reset signal will return to 0 at the end of the write cycle, after the filter circuit RFt has been operatively reconnected to the interface INTB.

Thus, any possible spurious signals originating from outside via the bus BUS, in particular the SDA line, do not disrupt the regulation performed by the filter circuit RFt during the write cycles. And, conversely, outside of the write cycles, communications on the bus with the communication interface using the filter circuit are not disrupted by the oscillation signal of the oscillator circuit.

Moreover, the time constant T of the filter circuit RFt is adjustable. In order to fully control the value of the time constant T for the write cycle, the means for generating the clock signal GENCLK are configured for adjusting the time constant T to a given value Tosc with a given precision.

In order to any avoid confusion, Tosc does not designate the period of the signal Fosc (Tosc≠1/Fosc). Tosc designates the time constant of the filter circuit RFt, whereas Fosc designates the oscillation signal or the frequency of the oscillation signal, and the generation of the oscillation signal Fosc is not based solely on the time constant Tosc of the filter circuit RFt.

The adjusted value Tosc corresponds to a value on which the regulation of the oscillation signal Fosc is based, and the precision corresponds to an elementary increment for modifying the time constant.

The filter circuit RFt may indeed provide for the adjustment of its time constant by internal means, and the adjustment may be achieved through a modification of connections of transistors, resistors or capacitors of the filter circuit with switches controlled by adjustment bits BitTr stored in a non-volatile register NVREG, as in the method previously described in relation to FIG. 1.

This embodiment of the memory integrated circuit NVM corresponds to a first alternative. In this alternative, the oscillator circuit RGOSC comprises a ring oscillator RGOSC configured for generating an accumulation of elementary delays t on a signal, in order to generate the oscillation signal Fosc. The elementary delays t are the switching times of various inverters in series in the ring.

Indeed, the ring oscillator RGOSC comprises a series of an odd number of inverters IV1, IV2, NE0, the inverter NE0 being a NAND gate controlled by a start signal RunOsc=1 in operation. Furthermore, the NAND gates NE1, NE2, NE4 and the inverter IV4, in addition to their functions of operatively connecting and disconnecting the filter circuit RFt, form said series of an odd number of inverters (in addition to the aforementioned inverters IV1, IV2, NE0). The inverters IV1, IV2 are optional and may be removed in order to reduce the number of elementary delays in the ring.

The means for generating the clock signal GENCLK are then configured for operatively connecting the filter circuit RFt in the circuit of the ring oscillator RGOSC, introducing an additional delay Tosc equal to the time constant of the filter circuit RFt. The accumulation of elementary delays t is negligible in duration with respect to the additional delay Tosc, which consequently produces said regulation of the oscillation signal Fosc, generating the clock signal CLK capable of timing the write cycle.

Figure 3:
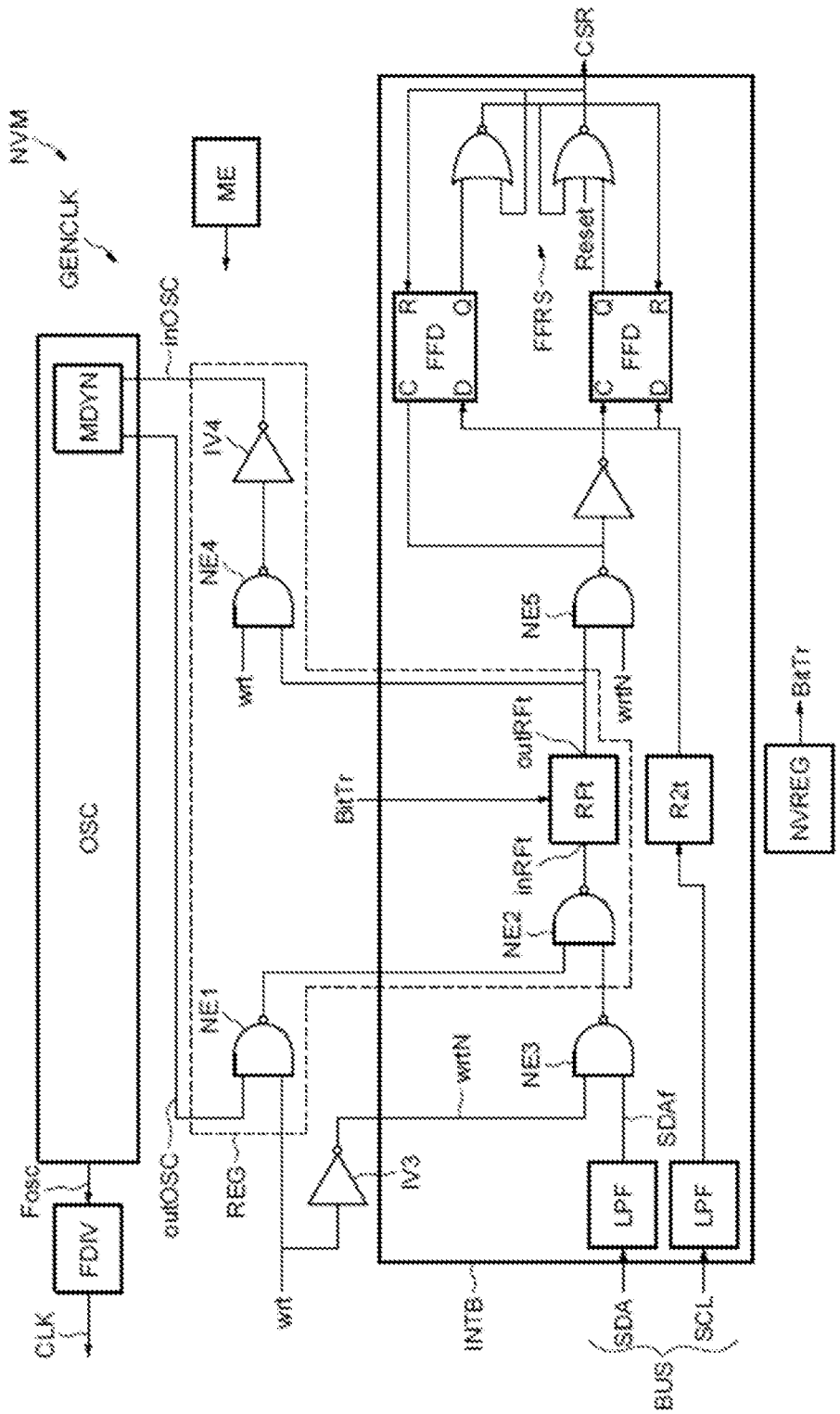

FIG. 3 represents another alternative oscillator circuit OSC, in the same embodiment as that described above in relation to FIG. 2. Except for the oscillator circuit OSC, the memory integrated circuit NVM comprises the same elements designated by the same references as in the embodiment described in relation to FIG. 2 and which will not be detailed again here.

In this alternative, the oscillator circuit OSC comprises an adjustment means MDYN capable of dynamically adjusting the frequency of the oscillation signal Fosc on command.

For regulating the oscillation signal Fosc, the means for generating the clock signal GENCLK are configured for controlling a dynamic adjustment of the frequency of the oscillation signal Fosc relative to a time constant Tosc of the filter circuit RFt.

The means for generating the clock signal GENCLK are, for example, configured for operatively connecting the filter circuit RFt with the dynamic adjustment means MDYN of the oscillator circuit OSC, by means of logic gates and the mode selection signal wrt as previously described in relation to FIG. 2.

Thus, the dynamic adjustment means MDYN can calibrate the frequency of the oscillation signal Fosc, based on the time constant Tosc of the filter circuit RFt. In this regard reference may be made to the description below in relation to FIGS. 4 and 5.

The integrated circuit may further comprise a charge pump circuit PCHV (FIG. 6A) configured for generating write high voltages comprising switchings of capacitive elements over to power supply voltages, the switchings being timed by the oscillation signal Fosc generated by the oscillator circuit OSC.

In this regard the oscillator circuit OSC is advantageously configured for generating an oscillation signal Fosc having a frequency of 10 MHz to 100 MHz.

The means for generating the clock signal GENCLK then advantageously comprise a frequency divider FDIV configured for dividing the frequency of the regulated oscillation signal Fosc for obtaining the clock signal CLK capable of timing the write cycle.

This type of oscillator circuit usually provided for the charge pump may produce an oscillation signal Fosc which may vary up to 25% in frequency, if it is not regulated.

Figure 4:
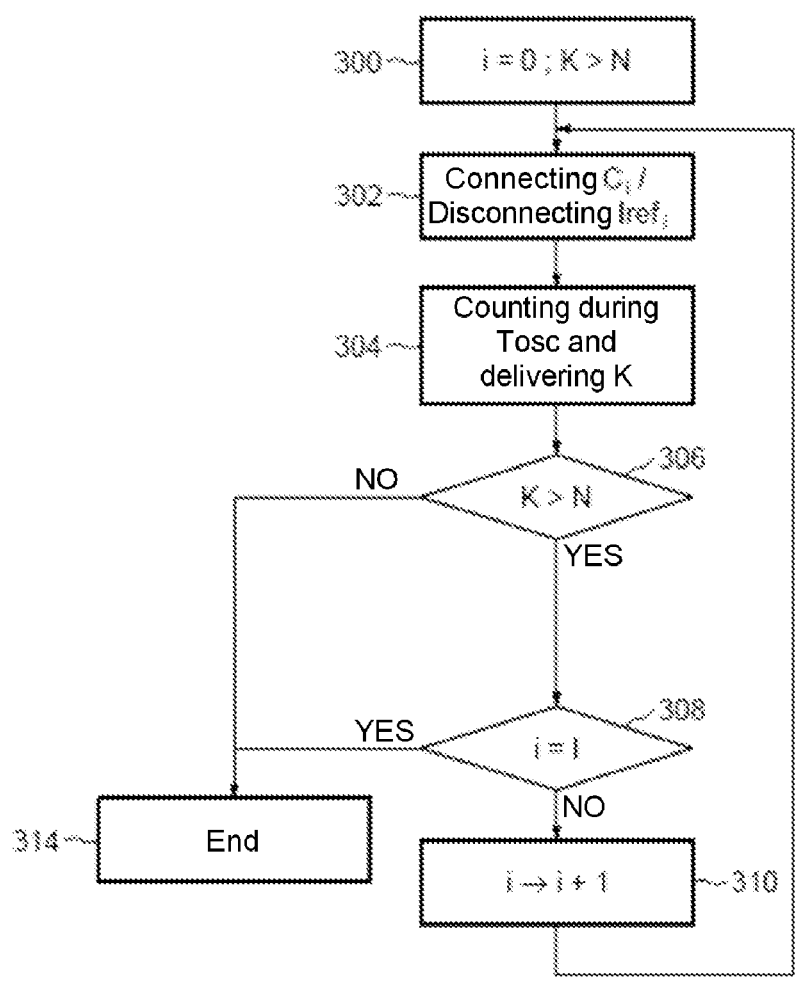

FIG. 4 illustrates an advantageous implementation allowing precise regulation of such an oscillation signal Fosc.

The regulation of the oscillation signal comprises a comparison 306 of the number of periods in the oscillation signal Fosc for the duration of the time constant of the filter circuit Tosc. In other words, step 306 makes it possible to assess the effective frequency of the oscillation signal Fosc, with respect to a time base given by the time constant Tosc of the filter circuit.

A dynamic adjustment of the frequency of the oscillation signal Fosc is performed relative to said time constant Tosc.

The regulation of the oscillation signal is, for example, performed at the start of each write cycle.

The dynamic adjustment of the frequency of the oscillation signal Fosc begins in this example with an initialization 300, in which an iteration counter is initialized, i=0, and the frequency Fosc of the oscillation signal is by default greater than the frequency of the desired regulated clock signal CLK (initially K>N, see below).

The dynamic adjustment of the frequency of the oscillation signal Fosc comprises an adjustment 302 of an elementary level of the frequency of the oscillation signal.

For example, connecting a capacitive element Ci or disconnecting a power supply current generator Irefi in the oscillator circuit OSC, makes it possible to reduce the frequency of the oscillation signal Fosc by a level.

The number K of periods of the oscillation signal Fosc is then counted 304 for the duration of the time constant Tosc of the filter circuit RFt.

The modification 302 and the counting 304 are then repeated until the number of counted periods K closest to a preset targeted number N is reached.

The targeted number N is preset according to the desired frequency of the clock signal CLK and the duration of the time constant Tosc of the filter circuit RFt.

If K>N 306, and if the iteration counter i has not reached a maximum possible iteration limit (i=I) 308, then the iteration counter is incremented i=i+1 and the modification 302, the counting 304 and the tests 306, 308 are repeated.

If K≤N (test 306), then it is considered that the number of counted periods K closest to the preset targeted number N has been reached, and the dynamic adjustment process of the frequency of the oscillation signal Fosc ends 314.

When the iteration counter i reaches the limit i=I, the dynamic adjustment process of the frequency of the oscillation signal Fosc 314 ends, as a protection against blocking, I is provided for normally never being reached (e.g., I=16).

Thus, the oscillator circuit OSC described with reference to FIG. 3 may comprise a counter configured for counting 304 the number of periods K of the oscillation signal Fosc for the duration of the time constant Tosc, and is configured for adjusting the frequency of the oscillation signal Fosc by a level 302, and for repeating the counting 304 and the adjustment 302 until the number of counted periods K closest to a preset targeted number is reached.

Figure 5:
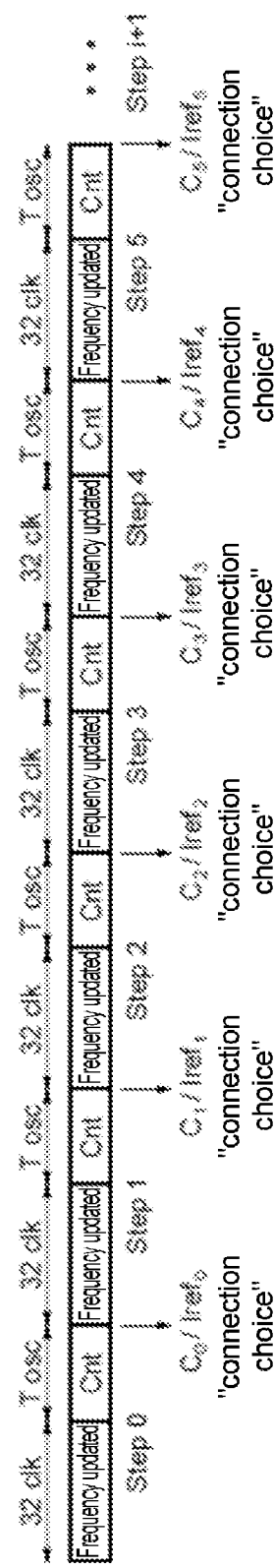

FIG. 5 temporally represents the implementation of the dynamic adjustment process of the frequency of the oscillation signal Fosc.

At each repetition Stepi (i=0 to 5) of the process, the frequency is updated for about 32 cycles of the oscillation signal, the number of periods of the oscillation signal is counted Cnt for the duration of the time constant Tosc and the choice of performing or not performing the adjustment according to Step+1 is made based on the comparison of the last count Cnt.

The total duration of the method making it possible to generate the clock signal for timing the write cycle, including in this implementation the dynamic adjustment process of the frequency of the oscillation signal Fosc, should not last more than 5% of the total duration of a write cycle, i.e., 0.2 ms maximum (considering a write cycle of a maximum of 4 ms in total).

FIGS. 6A and 6B respectively illustrate an example of a first alternative and an example of a second alternative of the EEPROM memory NVM integrated circuit CI.

In the two alternatives, the integrated circuit CI incorporates a memory plane PM and decoders of rows and columns XDEC, YDEC, a charge pump PCHV, and a state machine ME controlling the decoders XDEC, YDEC and the charge pump PCHV, the state machine ME distributes the voltages of the charge pump PCHV to the decoders XDEC, YDEC and is timed by a clock signal CLK.

The clock signal CLK is generated by clock signal generating means GENCLK as previously described in relation to FIGS. 1 to 5. The clock signal generating means GENCLK are thus notably configured for operatively connecting (via a mode selection signal wrt) a filter circuit belonging to a communication interface INTB physically connected to a bus BUS with an oscillator circuit, and regulating, with the filter circuit, an oscillation signal generated by the oscillator circuit so as to generate the clock signal CLK.

FIG. 6A illustrates an example of the first alternative as previously described in relation to FIG. 2. In the first alternative, a fast oscillator OSC is exclusively intended for supplying the charge pump PCHV and the oscillator circuit (RGOSC, FIG. 2) used for generating the clock signal CLK is included in the generating means block GENCLK, such as a ring oscillator circuit.

FIG. 6B illustrates an example of the second alternative as previously described notably in relation to FIG. 3. In the second alternative, the generating means GENCLK comprise a fast oscillator (OSC, FIG. 3) and make it possible both to supply the charge pump PCHV with the regulated fast oscillation signal Fosc, and to generate the clock signal CLK, after its frequency Fosc is divided by a frequency divider FDIV.

In summary, embodiments and implementations have been described making it possible to generate stable frequencies based on a time base already present on the circuit for other purposes, and not used for its initial purpose when it is used for stabilizing the frequencies.

This is possible since the stabilization of the frequency of the oscillators is performed during the execution of a write operation, and, for example, when this time base is present in a filter used in the I²C interface. Indeed, an EEPROM memory executing a write cycle ignores the commands passing over the I²C bus, thereby freeing the time base present in the filter.

In a first approach, the stabilization is performed by inserting the time base in a ring oscillator. With regard to the mentioned stability constraints, its duration will be significant with respect to all the propagation delays of the gates in the ring, which is preferably suited to relatively slow oscillators (clock). A faster oscillator for a charge pump may require a separate circuitry not benefiting from this stabilization.

In a second approach, the stabilization is performed prior to each use of the oscillator, by comparing a multiple of the period of the oscillator to the time base, and by adjusting the frequency according to the result of this comparison. The context of the execution of a write operation (a short duration, e.g., 4 ms, a constant supply voltage and temperature during the period of use of the oscillator) means that the initial calibration is effective at the end of the write cycle. This second approach is suited to fast oscillators (e.g., intended for the charge pump) and makes it possible by frequency division to generate the clock signal, ensuring additional space saving.

In the two approaches provided, a calibration of the time base may be performed by loading "factory" settings previously set up before the start-up of the oscillator or before its dynamic calibration for improving the precision of the frequency. This calibration is typically not necessary when the time base is used in the communication interface, the required precision being typically coarser (the calibration parameters then not being used).

Of course, the invention is not limited to these implementations and embodiments but encompasses all the variants and may, for example, be applied to other types of non-volatile memories, the oscillator circuit being able to be of another design capable of being regulated according to the invention, the filter circuit used for the regulation may belong to an element of the integrated circuit other than a communication interface, or the dynamic adjustment process of the frequency of the oscillation signal described in relation to FIGS. 4 and 5 may vary while remaining within the scope of the invention.

What is claimed is:

1. A method for writing to an electrically erasable and programmable non-volatile memory, the method comprising:
    operatively connecting a filter circuit belonging to a communication interface to an oscillator circuit, wherein the communication interface is physically connected to a bus, and wherein operatively connecting the filter circuit comprises transitioning the filter circuit from a disabled state to an enabled state, the enabled state comprising enabling access to functions of the filter circuit, the disabled state comprising a bypass mode corresponding to the filter circuit being non-operational and the oscillator circuit receiving a valid signal;
    generating, by the oscillator circuit, an oscillation signal by accumulating elementary delays; and
    regulating the oscillation signal by the filter circuit to generate a clock signal for timing a write cycle, the regulating comprising inserting an additional delay equal to a time constant of the filter circuit into the accumulation of elementary delays, the accumulation of elementary delays being negligible in duration with respect to the additional delay.

2. The method according to claim 1, further comprising, before operatively connecting the filter circuit to the oscillator circuit, operatively disconnecting the filter circuit from the communication interface.

3. The method according to claim 2, wherein operatively disconnecting the filter circuit and the communication interface comprises:
    providing a signal originating from the communication interface to the filter circuit with a mode selection signal, the mode selection signal determining a signal with a constant arbitrary value; and
    providing a signal originating from the filter circuit to the communication interface with the mode selection signal.

4. The method according to claim 1, further comprising, before operatively connecting the filter circuit to the oscillator circuit, operatively disconnecting the filter circuit from the oscillator circuit and operatively connecting to the communication interface.

5. The method according to claim 1, wherein operatively connecting the filter circuit and the oscillator circuit comprises:
    providing a signal originating from the oscillator circuit to the filter circuit with a mode selection signal; and
    providing a signal originating from the filter circuit to the oscillator circuit with the mode selection signal.

6. The method according to claim 1, further comprising, before regulating the oscillation signal with the filter circuit, adjusting a time constant to a given value with a given precision, wherein the filter circuit comprises the adjustable time constant.

7. A method for writing to an electrically erasable and programmable non-volatile memory, the method comprising:
    operatively connecting a filter circuit belonging to a communication interface to an oscillator circuit, wherein the communication interface is physically connected to a bus, and wherein operatively connecting the filter circuit comprises transitioning the filter circuit from a disabled state to an enabled state, the enabled state comprising enabling access to functions of the filter circuit, the disabled state comprising a bypass mode corresponding to the filter circuit being non-operational and the oscillator circuit receiving a valid signal;
    generating, by the oscillator circuit, an oscillation signal;
    regulating the oscillation signal by dynamically adjusting a frequency of the oscillation signal relative to a time constant of the filter circuit and dividing a frequency of the regulated oscillation signal to generate a clock signal for timing a write cycle; and
    generating write high voltages in the write cycle by switching capacitive elements to supply voltages, the switching of the capacitive elements being timed by the oscillation signal.

8. The method according to claim 7, wherein regulating the oscillation signal comprises regulating the oscillation signal at a start of each write cycle.

9. The method according to claim 7, wherein dynamically adjusting the frequency of the oscillation signal comprises counting a number of periods of the oscillation signal for a duration of a time constant, adjusting a level of the frequency of the oscillation signal, and repeating the counting and the adjusting until the number of counted periods closest to a preset targeted number is reached.

10. An integrated circuit comprising:
    a state machine configured to control write operations in a write cycle timed by a clock signal;
    a communication interface comprising a filter circuit and configured to be physically connected to a bus; and
    a clock signal generator comprising an oscillator circuit and logic gates connected to an input of the filter circuit and an output of the filter circuit, the logic gates configured to generate signals with a constant arbitrary value in a presence of a mode selection signal to operatively disconnect the filter circuit and the communication interface, wherein operatively disconnecting the filter circuit comprises transitioning the filter circuit from an enabled state to a disabled state, the enabled state comprising enabling access to functions of the filter circuit, the disabled state comprising a bypass mode corresponding to the filter circuit being non-operational and the oscillator circuit receiving a valid signal, the clock signal generator configured to:
        operatively disconnect the filter circuit from the communication interface, operatively connect the filter circuit to the oscillator circuit after operatively disconnecting the filter circuit from the communication interface, generate an oscillation signal, and regulate the oscillation signal by the filter circuit to generate the clock signal in the write cycle, wherein the integrated circuit is an integrated circuit of an electrically erasable and programmable non-volatile memory.

11. The integrated circuit according to claim 10, wherein the clock signal generator is configured to operatively disconnect the filter circuit from the communication interface before operatively connect the filter circuit to the oscillator circuit.

12. The integrated circuit according to claim 10, wherein the filter circuit is configured to be operatively disconnected from the oscillator circuit and to be operatively connected to the communication interface before being operatively connected to the oscillator circuit.

13. The integrated circuit according to claim 10, wherein the clock signal generator is further configured to:

generate a first signal to the input of the filter circuit in the presence of the mode selection signal; and generate a second signal to an input of the oscillator circuit in the presence of the mode selection signal to operatively connect the filter circuit to the oscillator circuit.

14. The integrated circuit according to claim 10, wherein the filter circuit comprises an adjustable time constant, and wherein the clock signal generator is configured to adjust the time constant to a given value with a given precision.

15. The integrated circuit according to claim 10, wherein the oscillator circuit comprises an adjustment module configured to dynamically adjust a frequency of the oscillation signal on command, and wherein the clock signal generator is configured to control a dynamic adjustment of the frequency of the oscillation signal relative to a time constant of the filter circuit for regulating the oscillation signal.

16. The integrated circuit according to claim 15, wherein the adjustment module comprises a capacitive element with controllable capacitive value, or a power supply current generator with controllable current intensity.

17. The integrated circuit according to claim 10, wherein, to operatively disconnect the filter circuit from the communication interface, the communication interface is configured to provide a signal to the filter circuit with a mode selection signal, the mode selection signal determining a signal with a constant arbitrary value, and wherein the filter circuit is configured to provide a signal to the communication interface with the mode selection signal.

18. The integrated circuit according to claim 10, wherein, to operatively connect the filter circuit to the oscillator circuit, the oscillator circuit is configured to provide a signal to the filter circuit with a mode selection signal, and wherein the filter circuit is configured to provide a signal to the oscillator circuit with the mode selection signal.

19. The integrated circuit according to claim 10, wherein regulating the oscillation signal comprises regulating the oscillation signal at a start of each write cycle.

20. The integrated circuit according to claim 10, wherein generating the oscillation signal comprises accumulating elementary delays, wherein regulating the oscillation signal comprises inserting an additional delay equal to a time constant of the filter circuit into the accumulation of elementary delays, and wherein the accumulation of elementary delays is negligible in duration with respect to the additional delay.

\* \* \* \* \*